(12) United States Patent
Ho et al.

(10) Patent No.: US 10,104,771 B1
(45) Date of Patent: Oct. 16, 2018

(54) METHOD FOR MAKING A CIRCUIT BOARD

(71) Applicants: Avary Holding (Shenzhen) Co., Limited., Shenzhen (CN);
HongQiSheng Precision Electronics (QinHuangDao) Co., Ltd., Qinhuangdao (CN)

(72) Inventors: Ming-Jaan Ho, New Taipei (TW);
Xian-Qin Hu, Guangdong (CN);
Fu-Yun Shen, Guangdong (CN);
Wen-Zhu Wei, Guangdong (CN)

(73) Assignees: Avary Holding (Shenzhen) Co., Limited., Shenzhen (CN);
HongQiSheng Precision Electronics (QinHuangDao) Co, Qinhuangdao (CN)

( * ) Notice: Subject to any disclaimer, the term of this patent is extended or adjusted under 35 U.S.C. 154(b) by 0 days.

(21) Appl. No.: 15/670,044

(22) Filed: Aug. 7, 2017

(30) Foreign Application Priority Data

Apr. 20, 2017 (CN) .......................... 2017 1 0260605

(51) Int. Cl.
| | | |
|---|---|---|
| *H01K 3/10* | (2006.01) | |
| *H05K 1/11* | (2006.01) | |
| *H05K 3/42* | (2006.01) | |
| *H05K 1/09* | (2006.01) | |
| *H05K 3/06* | (2006.01) | |
| *H05K 3/02* | (2006.01) | |

(52) U.S. Cl.
CPC .............. *H05K 1/115* (2013.01); *H05K 1/09* (2013.01); *H05K 3/027* (2013.01); *H05K 3/067* (2013.01); *H05K 3/425* (2013.01); *H05K 2201/0355* (2013.01); *H05K 2203/0369* (2013.01); *Y10T 29/49165* (2015.01)

(58) Field of Classification Search
CPC ........ H05K 1/112; H05K 1/115; H05K 3/384; H05K 2201/0355; H05K 3/387; H05K 2201/09563; H05K 2203/0361; C23C 18/1893; Y10T 29/49155; Y10T 29/49165; C25D 1/003; C25D 5/34
USPC ........................... 29/852, 825, 829, 846, 849
See application file for complete search history.

(56) References Cited

U.S. PATENT DOCUMENTS

| | | | | |
|---|---|---|---|---|
| 7,504,719 B2* | 3/2009 | En | ............................. | C23G 1/10 257/700 |
| 9,894,765 B2* | 2/2018 | Miura | .................... | H05K 1/115 |

\* cited by examiner

*Primary Examiner* — Thiem Phan
(74) *Attorney, Agent, or Firm* — ScienBiziP, P.C.

(57) ABSTRACT

A method for making a circuit board comprising: providing a silver clad laminate comprising a substrate and two silver foils; forming at least one through hole on the silver clad laminate, the through hole comprises an annular middle wall and two annular edge walls connected to two sides of the annular middle wall; forming an organic conductive film on the annular middle wall; forming a dry film pattern layer on the second area; plating copper to form a copper circuit layer on the first area, and to form a via hole in the through hole; removing the dry film pattern layer; and etching the second area of the silver foil away. The first area changes to a silver circuit layer. The copper circuit layer and the silver circuit layer define a conductive circuit layer. A circuit board made by the method is also provided.

7 Claims, 4 Drawing Sheets

METHOD FOR MAKING A CIRCUIT BOARD

FIELD

The subject matter herein generally relates to a circuit board, and a method for making the circuit board.

BACKGROUND

Circuit boards generally need a highly complex, highly precise, and high-density wiring layout. Thus, a conductive circuit of the circuit board needs to have small line width and small line spacing. Conductive circuit of the circuit board is made by: providing a copper clad laminate includes a copper foil, the copper foil includes a first patterned area and a second patterned area; plating copper circuit layer on the first patterned area, the second patterned area exposes through a clearance of the copper circuit; and etching the copper foil of the patterned second area. During the etching process, the copper circuit layer will be etched too. The bottom copper foil can be etched more than the upper copper foil, leading to undercutting, thus, reducing the binding strength between the substrate and the copper circuit layer. Improvement in the art is preferred.

BRIEF DESCRIPTION OF THE DRAWINGS

Implementations of the present technology will now be described, by way of example only, with reference to the attached figures.

DETAILED DESCRIPTION

Figure 1:
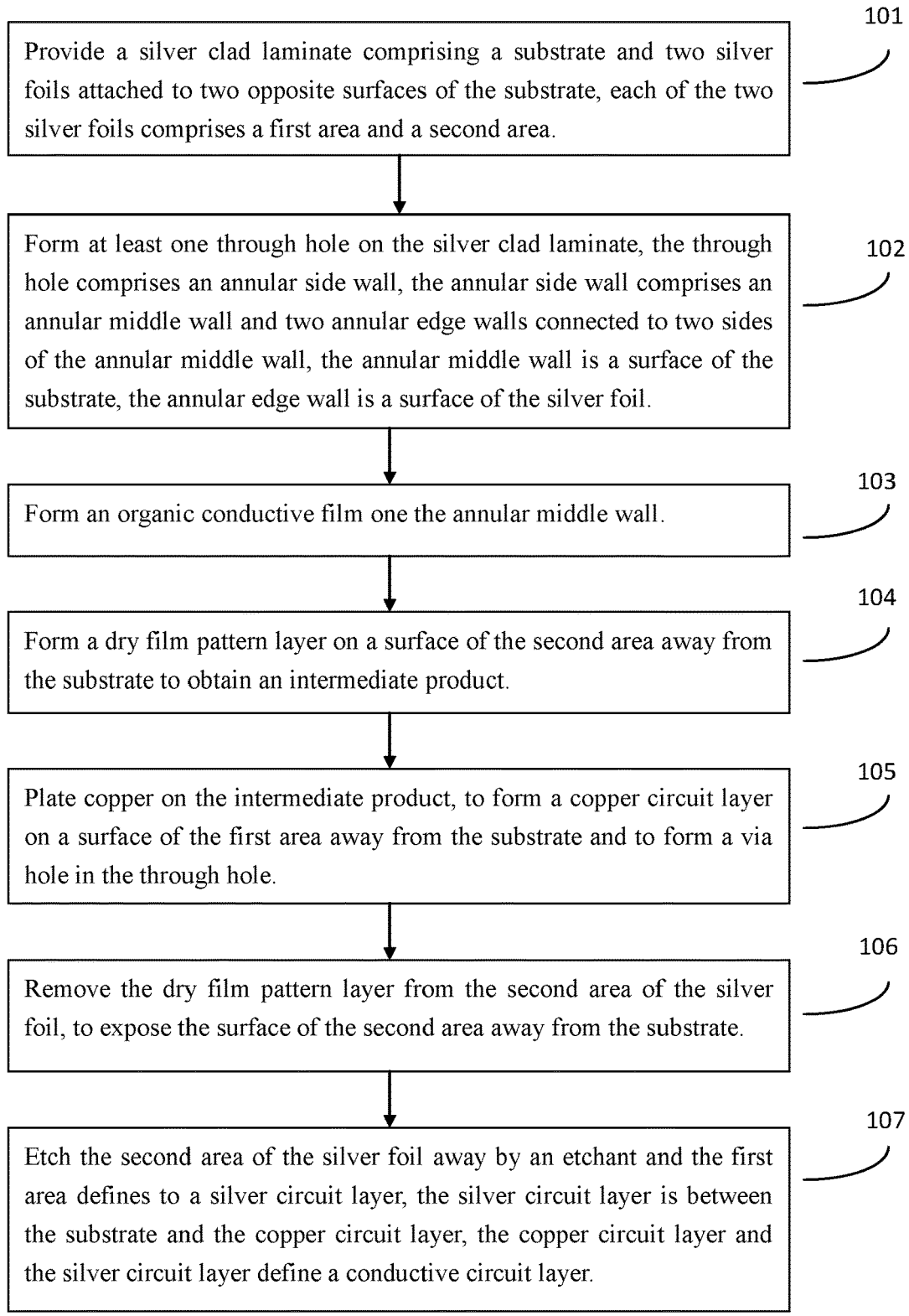
FIG. 1 is flowchart of a method for making a circuit board.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

Several definitions that apply throughout this disclosure will now be presented.

The term "comprising" when utilized, means "including, but not necessarily limited to"; it specifically indicates open-ended inclusion or membership in the so-described combination, group, series, and the like. The term "about" when utilized, means "not only include the numerical value, but also include numbers close to the stated numerical value".

FIG. 1 illustrates a flowchart of a method for making a circuit board 300 (shown in FIG. 10) in accordance with an exemplary embodiment. The exemplary method is provided by way of example, as there are a variety of ways to carry out the method. Each block shown in the figure represents one or more processes, methods, or subroutines, carried out in the exemplary method. Furthermore, the illustrated order of blocks is by example only and the order of the blocks can change. Additional blocks may be added or fewer blocks may be utilized, without departing from this disclosure. The exemplary method may begin at block 101.

Figure 2:
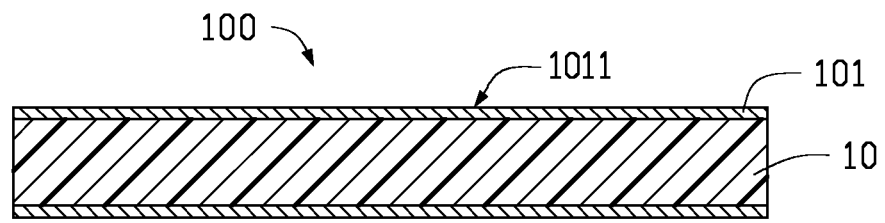
FIGS. 2-11 show an exemplary embodiment of the method of making a circuit board.

At block 101, referring to FIG. 2, a silver clad laminate 100 is provided. The silver clad laminate 100 includes a substrate 10, and two silver foils 101 attached to two opposite surfaces of the substrate 10.

Figure 8:
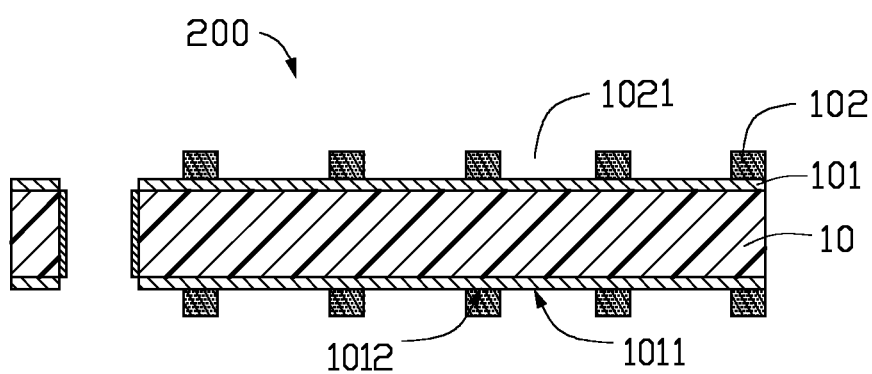

Each of the two silver foils 101 includes a first area 1011 for forming a copper circuit layer 31 (shown in the FIG. 8), and a second area 1012 not forming a copper circuit layer 31 (shown in the FIG. 8).

In at least one exemplary embodiment, a method for making the silver clad laminate 100 includes the following steps: providing the substrate 10 and a silver ink; coating the silver ink on two opposite surfaces of the substrate 10; drying the silver ink to form the silver foil 101.

In at least one exemplary embodiment, a method for coating the silver ink on two opposite surfaces of the substrate 10 may be intaglio printing, spraying, or sputtering.

In at least one exemplary embodiment, the substrate 10 is made of polyimide. In other embodiment, the substrate 10 may be made of materials conventionally used in circuit board substrate.

In at least one exemplary embodiment, a thickness of the silver foil 101 is about 0.15 μm to about 0.3 μm.

Figure 3:
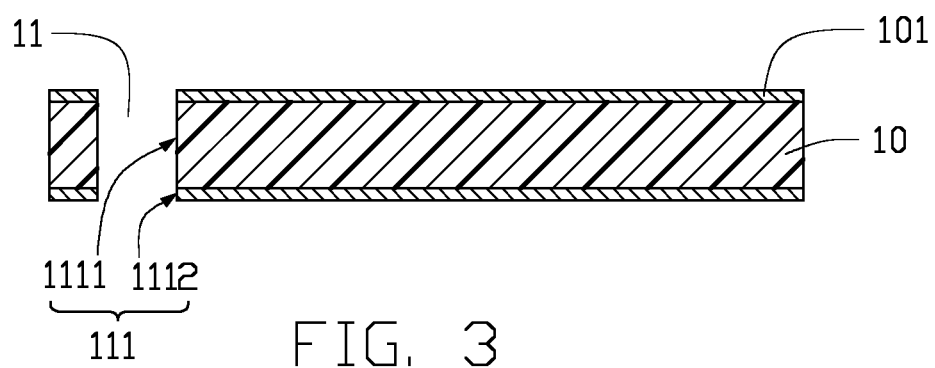
Figure 4:
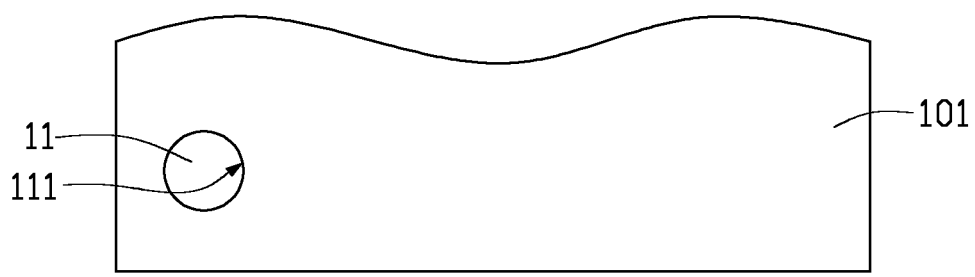

At block 102, referring to FIG. 3 and FIG. 4, at least one through hole 11 is formed on the silver clad laminate 100.

Each of the at least one through hole 11 penetrates the substrate 10 and silver foils 101 attached on two opposite surfaces of the substrate 10. Each of the at least one through hole 11 includes an annular side wall 111 as shown in FIG. 4 in the exemplary embodiment. The annular side wall 111 includes an annular middle wall 1111 and two annular edge walls 1112 connected to two sides of the annular middle wall 1111. The annular middle wall 1111 is a surface of the substrate 10. Each of the two annular edge walls 1112 is a surface of a silver foil 101.

The through hole 11 may be formed by laser drilling.

Figure 5:
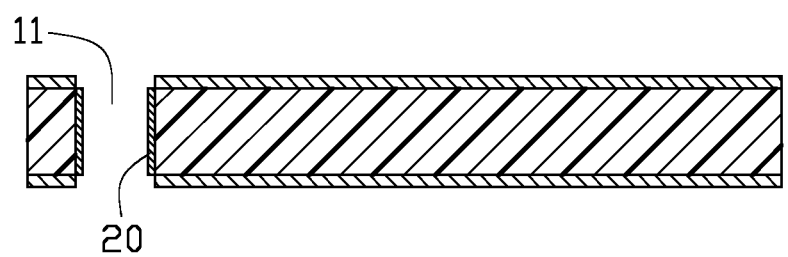

At block 103, referring to FIG. 5, an organic conductive film 20 is formed on the annular middle wall 1111.

A method for forming the organic conductive film 20 may include the following steps: (1) treating the annular middle wall 1111 of the through hole 11 with a pore former, to form a negatively charged layer (not shown) on the annular middle wall 1111; (2) providing an organic solution, the organic solution comprises organic sulfonic acid and an organic monomer, the organic sulfonic acid is a reducing agent, the organic monomer may be 1,2-Ethanedithiol (EDT); (3) immersing the annular middle wall 1111 into the organic solution; (4) adding manganese dioxide ($MnO_2$) into the organic solution, under catalysis of manganese dioxide, the organic monomer undergoes a chemical reaction to form an organic conductive film 20 on the annular middle wall 1111.

In other exemplary embodiment, in step (4), the manganese dioxide is replaced by potassium permanganate ($KMnO_4$). In the organic solution, the potassium permanganate undergoes an oxidation-reduction reaction to form manganese dioxide.

In the method for forming the organic conductive film 20, the silver foil 101 does not react with the organic solution, thus the silver foil 101 cannot be corroded by the organic solution.

At block 104, referring to FIG. 8, a dry film pattern layer 102 is formed on a surface of the second area 1012 away from the substrate 10, thus an intermediate product 200 is achieved.

The dry film pattern layer 102 defines a clearance 1021. A surface of the first area 1011 away from the substrate 10 is exposed through the clearance 1021.

Figure 6:
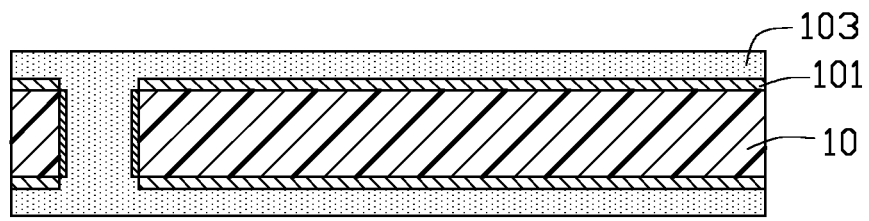
Figure 7:
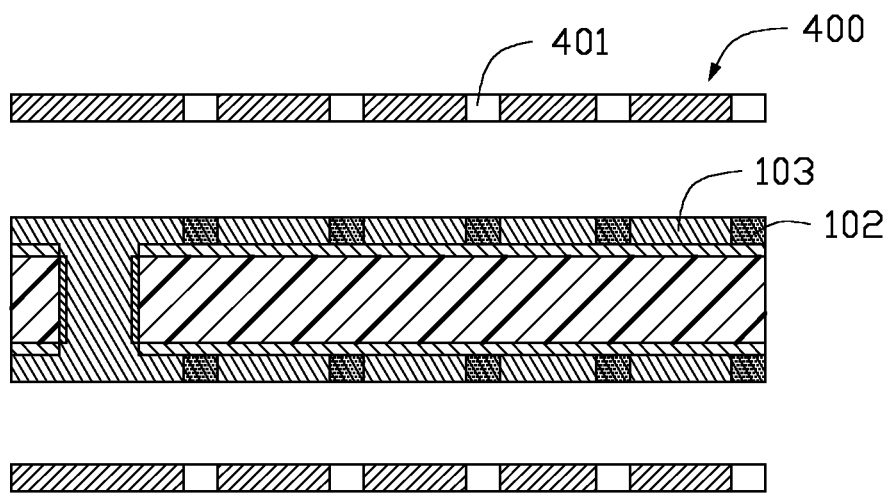

A method for forming a dry film pattern layer 102 on a surface of the second area 1012 away from the substrate 10 may include following steps: (1) referring to FIG. 6, forming a dry film 103 on a surface of the silver foil 101 away from the substrate 10 and in the through hole 11; (2) referring to FIG. 7, providing two shading plates 400, each shading plate 400 defines at least one light through hole 401; (3) placing each shading plate 400 at a side of the dry film 103 away from the substrate 10, the light through hole 401 faces a portion of the dry film 103 attached on the second area 1012; (4) irradiating light through a side of each shading plate 400 away from the dry film 103, a portion of the light passes through the light through hole 401 and irradiates the portion of the dry film 103 attached on the second area 1012, the portion of the dry film 103 attached on the second area 1012 forms a dry film pattern layer 102; (5) referring to FIG. 8, developing to remove the dry film 103 which has not been irradiated by light, to form the intermediate product 200.

Figure 9:
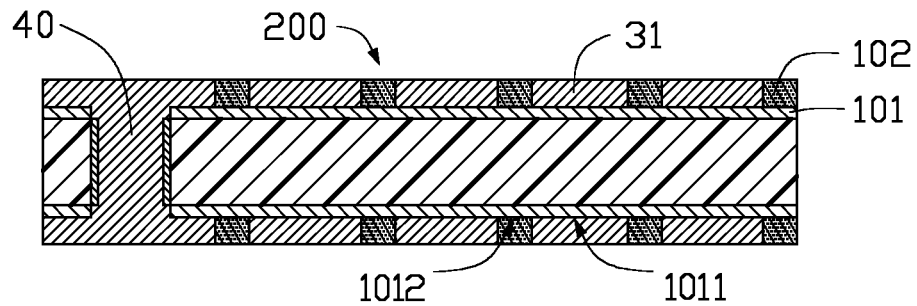

At block 105, referring to FIG. 9, the intermediate product 200 is plated with copper, to form a copper circuit layer 31 on a surface of the first area 1011 away from the substrate, and to form a via hole 40 in the through hole 11.

The via hole 40 is electrically connected with the copper circuit layer 31. The via hole 40 is integrally formed with the copper circuit layer 31. The copper circuit layer 31 infills the clearance 1021 of the dry film pattern layer 102.

Figure 10:
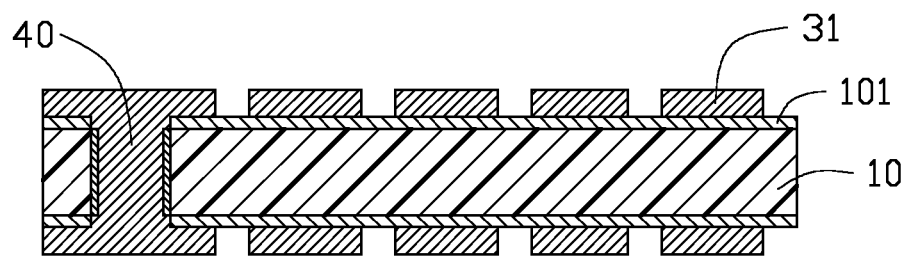

At block 106, referring to FIG. 10, the dry film pattern layer 102 is removed from the second area 1012 of the silver foil 101, to expose the surface of the second area 1012 away from the substrate 10.

Figure 11:
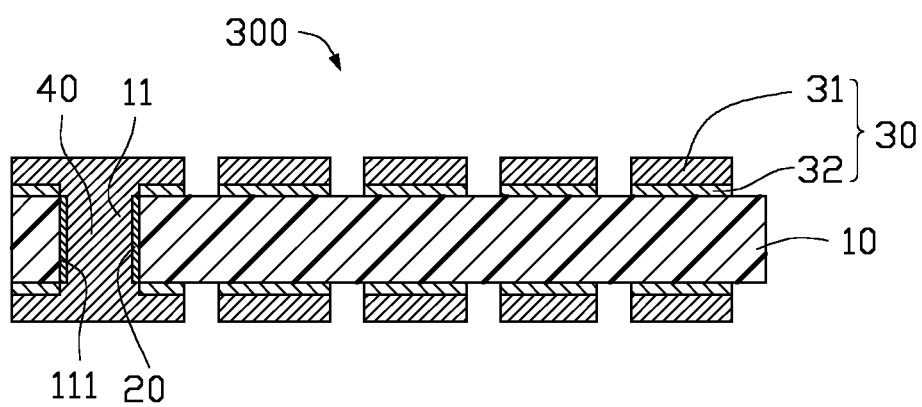

At block 107, referring to FIG. 11, the second area 1012 of the silver foil 101 is etched away by an etchant, the first area 1011 defines to be a silver circuit layer 32. The silver circuit layer 32 is located between the substrate 10 and the copper circuit layer 31. The copper circuit layer 31 and the silver circuit layer 32 define a conductive circuit layer 30. Thus, a circuit board 300 is formed.

The etchant may be selected from a mixed solution of ammonium hydroxide ($NH_4OH$), hydrogen peroxide ($H_2O_2$), and methanol ($CH_3OH$), a mixed solution of hydrogen chloride (HCl), hydrogen peroxide, and water, or a mixed solution of potassium iodide (KI), iodine ($I_2$), and water. In at least one exemplary embodiment, in the mixed solution of ammonium hydroxide, hydrogen peroxide, and methanol, a ratio of the ammonium hydroxide, hydrogen peroxide, and methanol is 1:1:4. In the mixed solution of hydrogen chloride, hydrogen peroxide, and water, a ratio of the hydrogen chloride, hydrogen peroxide, and water is 1:1:1. In the mixed solution of potassium iodide, iodine, and water, a ratio of the potassium iodide, iodine, and water is 4:1:40. In other exemplary embodiment, the ratios are not limited.

The etchant can etch silver but cannot etch copper, thus the copper circuit layer 31 cannot be etched. The etchant can etch silver quickly, an etching speed may be greater than or equal to 3600 Å/min, thus the silver can be etched away quickly, undercutting of the circuit 30 does not occur or is light. The etchant can be washed away easily.

A circuit board 300 manufactured by the method has small line width and small line spacing. A line width to line spacing of the conductive circuit layer 30 is less than or equal to 10 μm/10 μm.

FIG. 11 illustrates a circuit board 300. The circuit board 300 includes a substrate 10, and two conductive circuit layers 30 attached to two opposite surfaces of the substrate 10. Each of the conductive circuit layers 30 includes a silver circuit layer 32 attached to a surface of the substrate 10, and a copper circuit layer 31 attached to a surface of the silver circuit layer 32 away from the substrate 10.

The substrate 11 defines at least one through hole 11. Each through hole includes an annular side wall 111. The annular side wall 111 includes an annular middle wall 1111 and two annular edge walls 1112 connected to two sides of the annular middle wall 1111. The annular middle wall 1111 is a surface of the substrate 10. Each of the two annular edge walls 1112 is a surface of a silver circuit layer 32.

The circuit board 300 further includes at least one organic conductive film 20, and at least one via hole 40. Each organic conductive film 20 is attached to an annular middle wall 1111. Each via hole 40 infills a through hole 11. The via hole 40 is electrically connected with the copper circuit layer 31. The via hole 40 is integrally formed with the copper circuit layer 31.

In at least one exemplary embodiment, the substrate 10 is made of polyimide. In other embodiment, the substrate 10 may be made of materials conventionally used in circuit board substrate.

A thickness of the silver circuit layer 32 is about 0.15 μm to about 0.3 μm.

A line width to line spacing of the conductive circuit layer 30 is less than or equal to 10 μm/10 μm.

The circuit board 300 may be, but is not limited to, a flexible circuit board, a high density interconnect circuit board, or a rigid-flexible printed circuit board.

The embodiments shown and described above are only examples. Even though numerous characteristics and advantages of the present technology have been set forth in the foregoing description, together with details of the structures and function of the present disclosure, the disclosure is illustrative only, and changes can be made in the detail, including in matters of shape, size, and arrangement of the parts within the principles of the present disclosure, up to and including, the full extent established by the broad general meaning of the terms used in the claims.

What is claimed is:

1. A method for making a circuit board comprising:
   providing a silver clad laminate, the silver clad laminate comprising a substrate and two silver foils attached to two opposite surfaces of the substrate, each of the two silver foils comprising a first area and a second area;
   forming at least one through hole on the silver clad laminate, the through hole comprising an annular side wall, the annular side wall comprising an annular middle wall and two annular edge walls connected to two sides of the annular middle wall, the annular middle wall being a surface of the substrate, each of the two annular edge walls being a surface of a silver foil;
   forming an organic conductive film on the annular middle wall;
   forming a dry film pattern layer on a surface of the second area away from the substrate to obtain an intermediate product;

plating copper on the intermediate product to form a copper circuit layer on a surface of the first area away from the substrate and to form a via hole in the through hole;

removing the dry film pattern layer from the second area of the silver foil to expose the surface of the second area away from the substrate;

etching the second area of the silver foil away by an etchant and the first area defining to be a silver circuit layer, the silver circuit layer being between the substrate and the copper circuit layer, the copper circuit layer and the silver circuit layer defining a conductive circuit layer.

2. The method of claim 1, wherein a thickness of the silver foil is about 0.15 μm to about 0.3 μm.

3. The method of claim 1, wherein forming an organic conductive film on the annular middle wall comprising:

treating the annular middle wall of the through hole with a pore former to form a negatively charged layer on the annular middle wall;

providing an organic solution comprising organic sulfonic acid and an organic monomer;

immersing the annular middle wall into the organic solution;

adding manganese dioxide into the organic solution to form an organic conductive film on the annular middle wall.

4. The method of claim 3, wherein forming an organic conductive film on the annular middle wall comprising:

treating the annular middle wall of the through hole with a pore former, to form a negatively charged layer on the annular middle wall;

providing an organic solution comprising organic sulfonic acid and an organic monomer;

immersing the annular middle wall into the organic solution;

adding potassium permanganate into the organic solution to form an organic conductive film on the annular middle wall.

5. The method of claim 1, wherein forming a dry film pattern layer on a surface of the second area away from the substrate comprising:

forming a dry film on a surface of the silver foil away from the substrate and in the through hole;

exposing a portion of the dry film attached on the second area to light to form a dry film pattern layer;

developing to remove the dry film not being exposed to light.

6. The method of claim 1, wherein the etchant is a mixed solution of ammonium hydroxide, hydrogen peroxide, and methanol, a mixed solution of hydrogen chloride, hydrogen peroxide, and water, or a mixed solution of potassium iodide, iodine, and water.

7. The method of claim 1, wherein a line width to line spacing of the conductive circuit layer is less than or equal to 10 μm/10 μm.

* * * * *

UNITED STATES PATENT AND TRADEMARK OFFICE
CERTIFICATE OF CORRECTION

PATENT NO. : 10,104,771 B1
APPLICATION NO. : 15/670044
DATED : October 16, 2018
INVENTOR(S) : Ming-Jaan Ho et al.

Page 1 of 1

It is certified that error appears in the above-identified patent and that said Letters Patent is hereby corrected as shown below:

On the Title Page

Please replace Item (73) regarding "Assignees" with the following:
(73) Assignees: Avary Holding (Shenzhen) Co., Limited., Shenzhen(CN);
HongQiSheng Precision Electronics (QinHuangDao) Co.,Ltd.,New Taipei(TW)

Signed and Sealed this
Twenty-sixth Day of November, 2019

Andrei Iancu
*Director of the United States Patent and Trademark Office*